United States Patent
Audet et al.

(10) Patent No.: US 6,652,290 B2
(45) Date of Patent: Nov. 25, 2003

(54) CONNECTING DEVICES AND METHOD FOR INTERCONNECTING CIRCUIT COMPONENTS

(75) Inventors: Gerald P. Audet, Granby (CA); Luc Guerin, Granby (CA); Jean-Luc Landreville, Granby (CA)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/978,128

(22) Filed: Oct. 15, 2001

(65) Prior Publication Data

US 2002/0019153 A1 Feb. 14, 2002

Related U.S. Application Data

(62) Division of application No. 09/516,904, filed on Mar. 1, 2000, now Pat. No. 6,302,702.

(30) Foreign Application Priority Data

Mar. 18, 1999 (CA) .............................................. 2266158

(51) Int. Cl.[7] .............................................. H01R 12/00
(52) U.S. Cl. .......................................... 439/66; 29/843
(58) Field of Search ..................... 29/843, 840; 439/66, 439/74, 72, 65, 71, 73, 91, 591; 361/784, 803, 789

(56) References Cited

U.S. PATENT DOCUMENTS

| | | | |
|---|---|---|---|
| 4,655,519 A | * | 4/1987 | Evans et al. ................... 439/66 |
| 4,751,199 A | | 6/1988 | Phy |
| 4,922,376 A | | 5/1990 | Pommer et al. |
| 5,033,970 A | | 7/1991 | Buchoff |
| 5,139,427 A | | 8/1992 | Boyd et al. |
| 5,273,438 A | | 12/1993 | Bradley et al. |
| 5,832,601 A | | 11/1998 | Eldridge et al. |
| 5,984,692 A | * | 11/1999 | Kumagai et al. .............. 439/66 |

FOREIGN PATENT DOCUMENTS

| | | |
|---|---|---|
| JP | PUPA 55-059746 | 5/1980 |
| JP | PUPA 05-041381 | 2/1993 |
| JP | PUPA 06-045719 | 2/1994 |
| JP | PUPA 06-052942 | 2/1994 |
| JP | PUPA 08-139226 | 5/1996 |
| JP | PUPA 10-012777 | 1/1998 |
| WO | WO 96/37333 | 11/1996 |

* cited by examiner

*Primary Examiner*—Jean F. Duverne
(74) *Attorney, Agent, or Firm*—Arthur J. Samodovitz

(57) ABSTRACT

An integrated circuit package having metallized contact pads is provided with electrically conducting devices permanently attached to each contact pad. The devices are flexed when so attached, and are aligned and assembled onto corresponding pads of a second electrical component (e.g., a printed circuit board) to provide electrical connection between the integrated circuit package and the second electrical component.

2 Claims, 4 Drawing Sheets

CONNECTING DEVICES AND METHOD FOR INTERCONNECTING CIRCUIT COMPONENTS

CROSS-REFERENCE TO COPENDING PATENT APPLICATION

This application is a divisional application of Ser. No. 09/516,904, filed May 1, 2000 now U.S. Pat. No. 6,302,702.

FIELD OF THE INVENTION

The present invention generally relates to methods and devices for interconnecting integrated circuit (IC) packages to printed circuit boards, e.g., in land grid array assemblies, using connecting devices having portions which are resilient or flexible.

BACKGROUND OF THE INVENTION

In the mounting of an integrated circuit package to a printed circuit board (PCB), or similar support substrate, there are different methods of providing electrical interconnections between the package's input/output (I/O) pads and the substrate's pads. One method of interconnection, referred to as land grid array interconnection, uses a land grid array socket. This socket comprises a plurality of compressible conductive elements placed between the IC package and the substrate.

The compressible conductive elements are maintained in an array that corresponds to the package I/O pad array, by means of an electrically insulating matrix that acts as a contact support, or retainer. The land grid array socket is placed between the package and substrate. The IC package and substrate are held together with appropriate compression hardware, thereby causing each and every conductive element to be compressed and thus create appropriate contact force between its corresponding IC package pad and substrate pad, which ensures an electrically conductive path between those pads.

An example of a land grid array socket is shown in U.S. Pat. No. 4,922,376 to Pommer et al, entitled "Spring Grid Array Interconnection for Active Microelectronic Elements" and issued May 1, 1990.

This patent describes the use of a plurality of conductive resilient elements, held in an insulating contact retainer having a plurality of apertures to hold each conductive element. The resilient elements provide an electrical connection between pads of the IC package and those of a substrate.

U.S. Pat. No. 5,139,427 to Boyd et al., entitled "Planar Array Connector and Flexible Contact Therefor", issued Aug. 18, 1992, shows another type of socket that can be used for land grid array interconnections. The individual contacts are formed of flat metal stock having spring characteristics including spring elements, held in a planar array by means of an insulating sheet fitted with openings, each opening containing a conductive spring contact.

In U.S. Pat. No. 5,273,438 to Bradley et al., entitled "Canted Coil Spring Array and Method for Producing the Same", issued Dec. 28, 1993, electrical contact in the land grid array socket is provided by an array of canted coil springs.

U.S. Pat. No. 5,033,970 to Buchoff, entitled "Self-mounted Chip Carrier" and issued Jul. 23, 1991, shows an elastomeric ring that provides electrical conductive paths, instead of individual elements as in the other documents cited above.

U.S. Pat. No. 5,832,601 to Eldridge et al., entitled "Method of Making Temporary Connections Between Electronic Components", issued Nov. 10, 1998, describes a method of attaching wires onto semiconductor dies, and use of these wires as resilient contact structures to perform electrical testing of the dies. This patent describes a method of manufacturing resilient contact structures, with soft core wires attached to a tip made from a sacrificial substrate, and subsequently coated with a hard material.

IC packages used for land grid array interconnection are usually ceramic or plastic type packages and, according to the present state of the art, as described above, have no interconnection means permanently attached to the metallized conductive I/O pads thereof Another commonly used method for electrically connecting integrated circuit packages to substrates is known as surface mounting. For this type of connection, leads, solder balls, or any other solderable interconnection means are permanently attached to the IC package; which in turn are permanently attached to the printed circuit board pads by means of soldering. U.S. Pat. No. 4,751,199 to Phy, entitled "Process for Forming a Compliant Lead Frame for Array-type Semiconductor Packages", issued Jun. 14, 1998, shows one example of a surface mountable component, with discrete compliant conductive elements suitable for surface attachment to the printed circuit board by conventional surface mount assembly soldering.

Comparing the aforementioned methods, it is understood that land grid array interconnections consist typically of a non-permanent mechanical assembly between the package and substrate, the package being demountable. This important advantage (demountability) is not available in the case of known surface mount assemblies. Furthermore, land grid array offers a more compliant interconnection than surface mount assembly, thereby offering improved reliability when such packages are submitted to thermal and mechanical stresses. On the other hand, land grid array interconnection methods typically require the use of a land grid array socket, which adds significant costs to the assembly. Use of a socket also requires precise alignment between the socket conductive elements and the package I/O pads, in order to provide the required conductive path to the substrate pads. Surface mount interconnection requires no such socket, since surface mount leads are already attached to the package before it is assembled to the printed circuit board.

Some work has been done by the assignee of the subject application in order to provide an electrical circuit package that could offer the combined advantages of surface mount and land grid array interconnection methods. For example, International Business Machines (IBM) Technical Disclosure Bulletin, September 1994, pages 395–396 entitled "High Density Compliant Connector and socket", teaches the use of wire balls attached to an IC package, in order to provide a high density demountable interconnection.

SUMMARY OF THE INVENTION

It is one object of the present invention to provide an integrated circuit package which includes the combined advantages of surface mount and land grid array interconnections.

It is a further object of this invention to provide a new and practical connection device and method for interconnecting electronic circuit components.

It is another object of this invention to provide for connecting devices which can be readily connected to the I/O pads of an integrated circuit component.

It is still another object of the present invention to provide interconnections from one planar substrate to another, where the substrates can be selected from the group of printed circuit board, ceramic, or other substrate common in the field.

It is a further object of the invention to provide for a new interconnecting device and the use of such devices in integrated circuit packages and integrated circuit assemblies.

According to one aspect of the invention there is provided an electrically conducting device for interconnecting respective contact pads positioned on two separate components. The device is a homogeneous element and comprises a surface portion and a flexible portion. The surface portion is adapted to be joined to a contact pad on a first component and an end of said flexible portion is adapted to be pressed against a contact pad on a second component to thereby provide an electrical connection between said contact pads on the two components.

According to another aspect of the invention there is provided an integrated circuit package comprising a package having a plurality of I/O pads and a plurality of electrically conducting connecting devices each comprising a surface portion and a flexible portion. Each said surface portion is joined to an I/O pad on the package and an end of each of said flexible portions is adapted to be pressed against a contact pad of a component to thereby provide an electrical connection between an I/O pad on the package and the contact pad of the component.

According to yet another aspect of the disclosed invention there is provided an integrated circuit assembly comprising a first electrical component having a plurality of pads; a second electrical component having a plurality of pads; and a plurality of conducting devices each comprising a surface portion and a flexible portion. Each surface portion of a conducting device is joined to a contact pad of the first component, and an end of said flexible portion of each conducting device is pressed against a contact pad on the second component to thereby flex the flexible portion and provide an electrical connection between the contact pads of the two components.

According to a further aspect of the invention, there is provided a method of attaching conducting devices to an array of contacts on a first electrical component. Each device comprises a surface portion and a flexible portion with each surface portion adapted for being joined to a contact pad on a surface of a first component and an end of the flexible portion adapted for being pressed against a contact pad on a second component to flex the flexible portion and thereby provide an electrical connection between the contact pads on the two components. The method further comprises the steps of providing a fixture having openings corresponding to the array of contacts on the first component, loading a plurality of the conducting devices in the fixture to position the devices in the openings, positioning the fixture adjacent the first component, and thereafter attaching each conducting device to the corresponding contact of the first component.

Further details and advantages of the invention will be apparent from the following description of the preferred embodiments of the invention, illustrated in the accompanying drawings.

DESCRIPTION OF THE PREFERRED EMBODIMENTS

Throughout this specification a number of terms are used to describe physical characteristics of the invention Such terms including "resilient", "flexible", "elastic deformation" and "compressible" are intended to be used interchangeably, and convey a characteristic of tending to return to the original shape or position once a force is removed.

Figure 1:
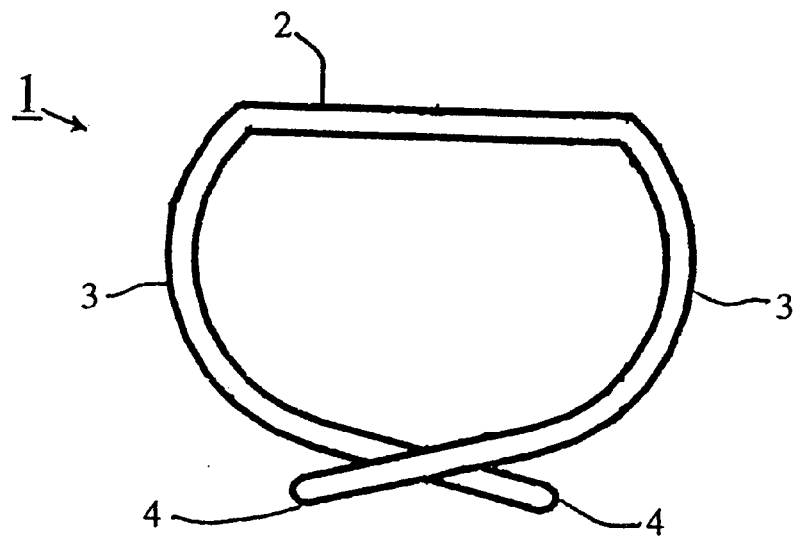
FIG. 1 is a side view of a single electrically conducting device according to a first preferred embodiment of the subject invention.

FIG. 1 shows one embodiment of a connecting, electrically conducting device 1 of the present invention. The device provides electrical connection between two components, for example between an IC package and a printed circuit board, when these two components are assembled together in a compressed assembly, similarly to a land grid array interconnection.

Device 1 may be permanently attached to an IC package I/O pad and provides connection to a printed circuit board pad by pressure contact only, thereby offering the advantage of demountability, without the need of a land grid array socket between the IC package and printed circuit board.

Figure 2:
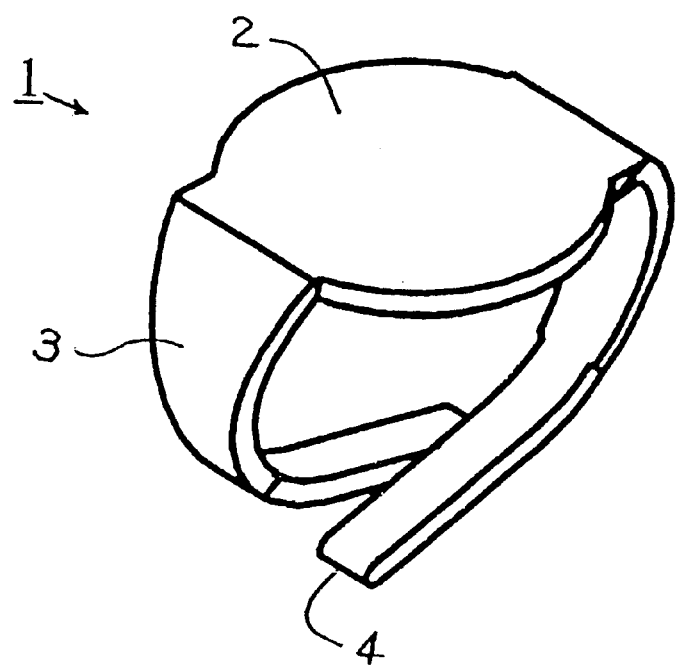
FIG. 2 is an isometric view of the device shown in FIG. 1.

Referring to FIG. 1, a connecting device, generally shown as (1) comprises a surface portion such as a flat surface portion (2), two independently compressible spring arms (3) attached to or forming an extension of surface portion (2), with each arm terminating in an end portion (4). Flat portion (2) provides an appropriate surface for being soldered to an IC package (FIG. 3) I/O pad. End portion (4) of each arm directly contacts a pad of a printed circuit board to provide pressure contact. Spring arms (3) are compressed or flexed when the IC package is pressed onto pads of a printed circuit board (FIG. 4), and both end portions (4) move toward the outside of the device, in opposite directions. Each spring arm (3) exhibits elastic compliance and maintains contact force, providing appropriate contact of the end portion (4) onto the printed circuit board I/O pad. FIG. 2 shows an isometric view of the same device, with various aspects being apparent from the above description of FIG. 1.

In order to have reliable electrical contact, there must be a constant contact force between the connecting device and the PCB pad. Coplanarity of the printed circuit board and IC package are typically not perfect. For a given IC package, each individual connecting device may not be compressed by the same amount Consequently, it is important that the connecting device is capable of providing an appropriate contact force, over a range of vertical compressive deformations.

As is apparent, the connecting devices have a specific shape that allows sufficient flexible and resilient compliance, in order to compensate for irregularities in the package and substrate surfaces, and still maintain appropriate elastic stress to provide necessary pressure to maintain contact on each of the substrate's I/O pads.

The connecting devices 1 (and 23 below) described herein can be constructed using conventional stamping or other conventional method. Appropriate surface finishes are applied with standard plating or inlay cladding methods.

In order to achieve the above goals, the shape and material composition of the connecting device are important aspects of this invention. Device (1) must be made of a material with suitable spring properties, for example, beryllium-copper, which is a well-known spring connector material used in the electronic industry. Beryllium-copper has a high elastic limit, that allows important elastic deformation before any permanent deformation is induced into the material. It is preferable that the conducting device (1) be made of metal material which is homogeneous. In this context, the term "homogeneous metal" as used herein is meant to include a single piece of metallic material of appropriate shape, with or without a coating on the single metal piece.

Shape of the connecting device is also significant in order to provide reliable contact between IC package and PCB pads. As shown in FIGS. 1 and 2, the connecting device (1) has a substantially circular shape that allows mechanical strain to be evenly distributed along the length of each spring arm (3), thereby avoiding stress concentration zones that could exceed the elastic limit of the material. Also, the shape provides, during compression of the assembly, frictional movement of end portions (4) on the surface of the PCB pad. This movement is called "wiping" and is useful in providing a local cleaning of any electrically insulative contamination present on the PCB pad or on the connecting device tip. Reliable electrical contact is obtained by use of appropriate surface finishes, for example, gold plating on both the connecting device end portions and printed circuit board pads may be used. One preferred way of fabricating the invention is to stamp the appropriate shape in a flat metal sheet, and then fold it into an appropriate form as shown in FIGS. 1 and 2.

Figure 3:
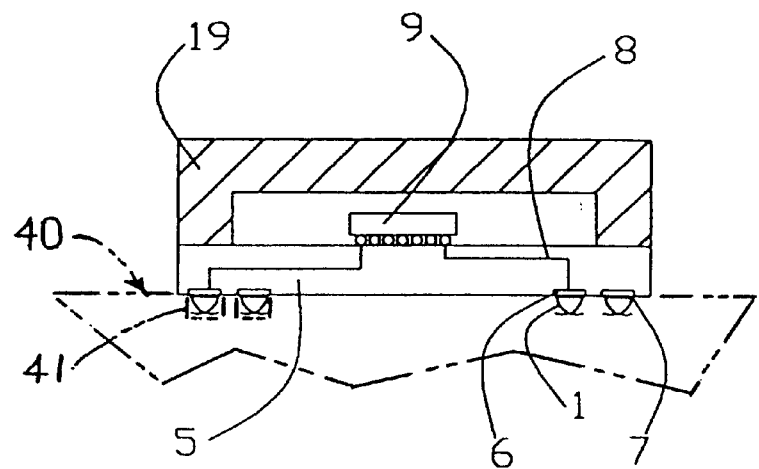
FIG. 3 is a side view showing an IC package with flexible connecting devices of the above embodiment of the present invention attached thereon.
Figure 4:
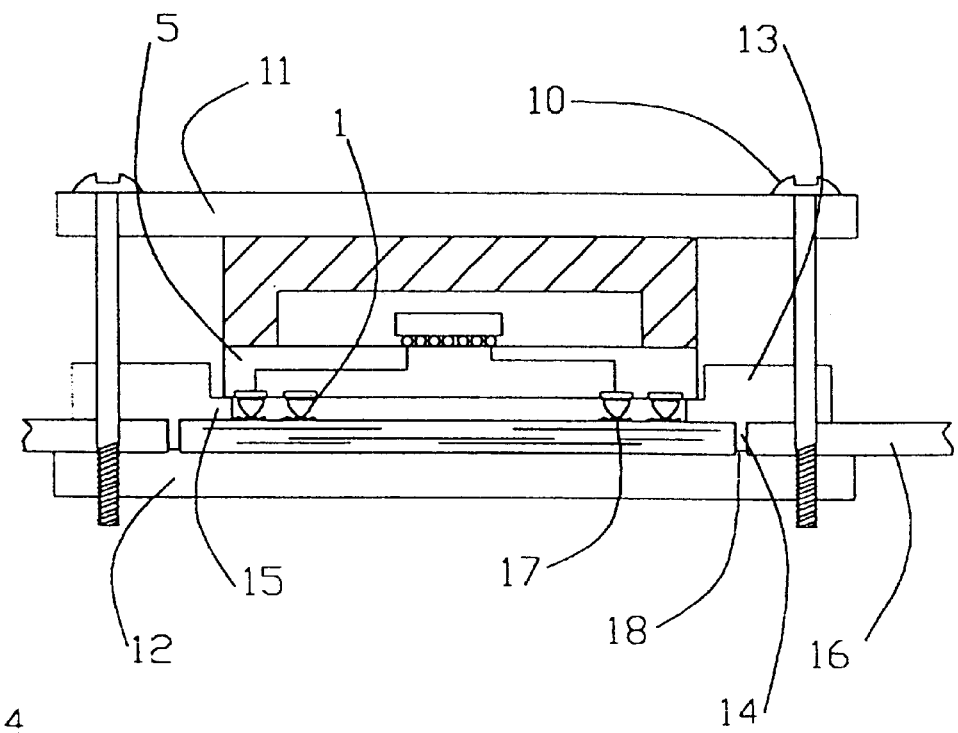
FIG. 4 is a side view showing the IC package of FIG. 3 after it is assembled on a substrate.

FIG. 3 shows a side view of an IC package (5) with compressible connecting devices (1), as described in FIGS. 1 and 2, attached to the package I/O pads (6). IC package (5) provides electrical pathways (8) between the IC (chip) (9) and the package I/O pads (6), as is known. Connecting devices (1) are attached to each of the package I/O pads (6), and provide interconnection of the package (5) to a printed circuit board 16 (FIG. 4). The substrate material of the IC package can be ceramic, laminate, molded plastic or other suitable material. Lid or cover (19) is optionally attached on top of package, as is also known.

In this embodiment, connecting devices are attached to the package I/O pads by an appropriate soldering method. Solder joint (7) provides permanent mechanical and electrical connection between respective surfaces (2) of connecting devices (1) and I/O pads (6). Conductive adhesive can also be used in place of solder.

A soldering fixture 40 (in phantom in FIG. 3) may be used in order to appropriately position and join the connecting devices onto the IC package I/O pads. Soldering fixture 40 comprises of a series of openings 41 (only two shown in FIG. 3), each opening having a position corresponding to an I/O pad of the IC package. A connecting device 1 is placed in each of the openings 41. The shape of each opening could match the shape of the flat surface of the connecting device to further properly maintain the position of the devices. Then, appropriate solder material (7) (for example 63% tin—37% lead solder alloy) is deposited on the IC package (6) or on the connecting device flat surfaces (2). The IC package is accurately placed adjacent the soldering fixture, and the complete assembly is heated above the solder material's melting point, thus causing solder reflow and providing, after cool down, a solder joint between each of the respective connecting devices 1 and the package I/O pad 6. The connecting devices can be placed on the I/O pads of the IC package and handled either as single units, or in groups of devices joined together by removable tabs of the same material, or even with sacrificial material such as tape, as is known for connecting various contacts together. Groups of connecting devices can be, for example, strips or arrays of devices. Where the devices are handled in groups, these can be singulated from each other after attachment to the respective package I/O pads. Also, in the case where devices are handled in groups, the fixture design can be significantly different from a fixture intended for handling a single device. The openings in the fixture would be appropriate for handling groups of devices and the openings in the fixture do not need to locate each individual device of a group. It is also possible to perform a final forming of the interconnecting device arms after the devices have been attached to the IC package.

FIG. 4 shows a side view of an IC package assembled on an appropriate substrate, usually a PCB 16. IC package (5), with connecting devices (1) pre-attached to its I/O pads, is assembled in compression onto the printed circuit board (16). Each connecting device will be compressed or flexed onto an individual printed circuit board pad (17), and provide electrical connection from the pads of the IC package (5) to the board's pad.

A set of hardware components is used to apply suitable compression force to the package to cause flexure of the connecting devices. This compression hardware may include retaining screws (10), a top plate (11), and a bottom plate (12) on which PCB 16 rests. During compression, retaining screws (10) are turned into the bottom plate (12), creating a compressive force on the array of connecting devices (1).

Alignment frame (13) is precisely located on printed circuit board (17) by alignment pins (14) which fit into corresponding printed circuit board locating holes (18). The alignment frame is used to provide accurate horizontal positioning of the package connecting devices with respect to corresponding printed circuit board pads (17).

Alignment frame (13) also provides standoff points (15) that have a particular thickness, determined so that appropriate compressive force is applied to the connecting devices. During the compression assembly, connecting devices are forced down into wiping mechanical contact with respective ones of the printed circuit board pads. If needed, a heat sink (not shown) can be used as part of this assembly, either as a part of the lid 19 attached on top of the package, or attached to an underside of the top plate.

Figure 5:
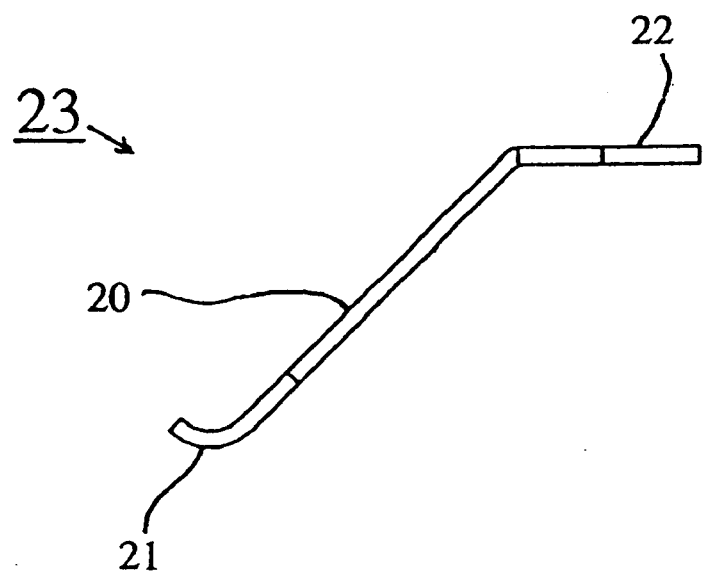
FIG. 5 is a side view of a single conducting device according to a second preferred embodiment of the invention.
Figure 6:
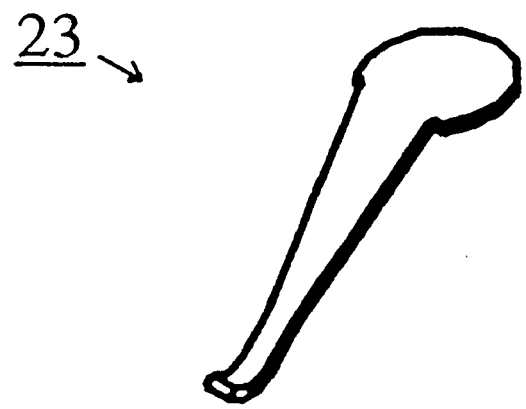
FIG. 6 is an isometric view of the conducting device shown in FIG. 5.

FIG. 5 shows a second preferred embodiment of a connecting device of the subject invention, generally shown as (23) with much of the description previously provided for FIGS. 1 to 4 also applying to this embodiment. As in the first preferred embodiment, this connecting device is a compressible spring element, and is intended to provide electrical conduction between an IC package and a printed circuit board. It comprises a surface portion shown as flat pad (22), one compressible and flexible spring arm (20), and an arm tip or end portion (21). Surface portion (22) provides an appropriate surface for soldering the connecting device onto an IC package I/O pad. Spring arm (20) is compressed when the IC package is pressed down onto a printed circuit board. Spring arm (20) must exhibit elastic compliance or resilience and maintain contact force in order to provide appropriate contact. The tip (21) directly contacts the pad of the printed circuit board. FIG. 6 shows an isometric view of connecting device 23. As described for the connecting device shown in FIG. 1, connecting device (23) may be made of homogeneous metal material.

As mentioned in the description of the first preferred embodiment, the shape of the connecting device is important in order to provide reliable contact between an IC package and PCB. As shown in FIG. 5, the connecting device arm (20) has a straight shape, positioned at an angle of approximately 45 degrees from the horizontal surface portion (22), which allows mechanical strain to be evenly distributed along the length of the spring arm (20), thereby avoiding stress concentration zones that would exceed the elastic limit of the material. The angle is not critical, however, as an angle in a range of positioning angles could be used as long as appropriate contact between the pads is maintained. Also, the appropriate shape provides, during compression assembly, a frictional movement of the connecting device tip (21) on the surface of a PCB pad. This movement is called "wiping" and is useful in providing local cleaning of any contamination present on the PCB pad or on the connecting device tip. Reliable electrical contact is obtained by use of appropriate surface finishes, for example, gold plating on both the connecting device tips (21) and/or printed circuit board pads. It is a requirement of this second preferred embodiment, that the package 110 pads are not positioned directly over the respective printed circuit board pads on which tip (21) will be compressed. Instead, the IC pads are oriented at a horizontal offset for proper operation and connection. Such an offsetting relationship is shown in FIG. 8.

Figure 7:
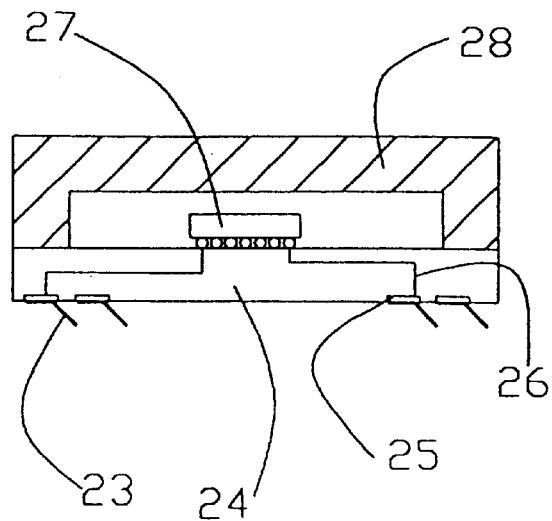
FIG. 7 is a side view showing an IC package with flexible conducting devices of the embodiment of the present invention shown in FIGS. 5 and 6 attached thereon.

FIG. 7 shows a side view of an IC package (24) with compressible connecting devices (23) attached to the package I/O pads (25). IC package (24) provides electrical pathways (26) between the IC (27) and the package I/O pads (25). Connecting devices (23) are attached to each of the package I/O pads, and will provide interconnection of the package to a printed circuit board 30 (FIG. 8). Lid (28) is optionally attached on top of the package. In this second preferred embodiment, connecting devices may be attached to the package I/O pads by the same soldering method as described for the first preferred embodiment.

Figure 8:
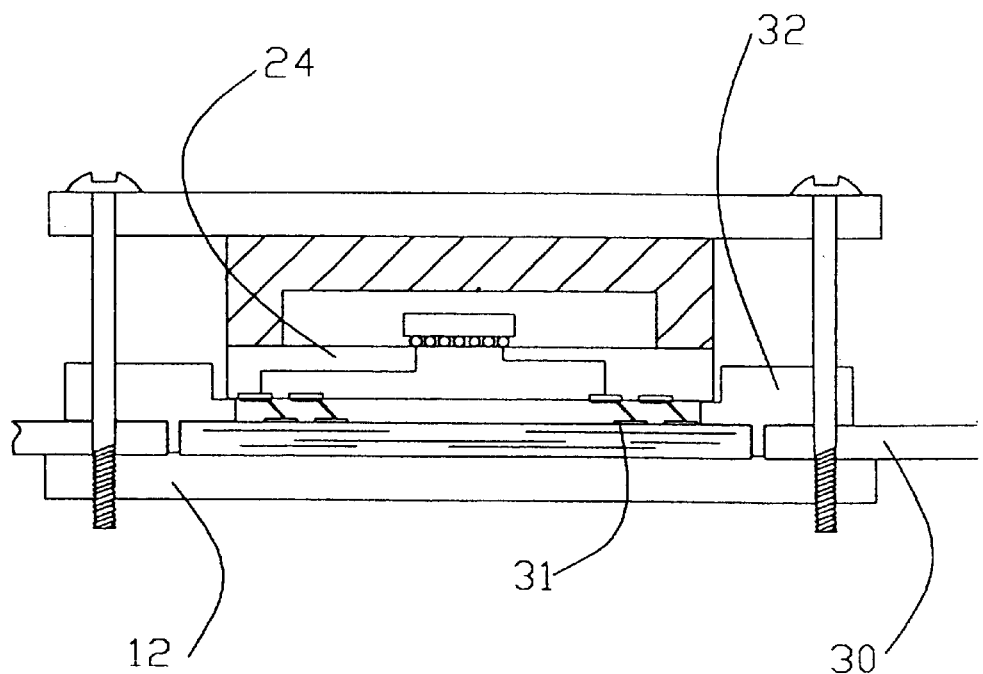
FIG. 8 is a side view showing the IC package of FIG. 7 after it is assembled on a substrate.

FIG. 8, in a similar manner as in FIG. 4, shows a side view of an IC package assembled on an appropriate substrate, usually a printed circuit board. IC package (24), with connecting devices (23) pre-attached to its I/O pads (25), is assembled in compression onto the printed circuit board (30). Each connecting device (23) will be compressed onto an individual printed circuit board pad (31), and thus provide electrical connection from the IC package (24) pads to the printed circuit board (30) pads, in a similar manner as described for the first preferred embodiment. A set of hardware components similar to those used in FIG. 4 may be used to apply suitable compression force to the package, in a similar way as in the first embodiment Alignment frame (32) may also be used to provide accurate horizontal positioning of the package connecting devices (23) with respect to corresponding printed circuit board pads (31). In this second embodiment, package I/O pads (25) are positioned to a specific horizontal offset relative to the printed circuit board pads (31). The above Figures of the drawings and accompanying description are provided for illustrative purposes only of preferred embodiments of the invention. The invention is not intended to be limited to the exact shape, number of pads or connecting devices or the specific materials shown or described herein. For example, a variety of other shapes can be used as leg members for the connecting devices, e.g., the legs can be flat metal, or even coil type springs.

The described interconnection system can also be used to interconnect two different printed circuit board assemblies together. First printed circuit assembly could have, on its surface, any combination of prepackaged integrated circuits, bare semiconductor dies, or discrete components. This first printed circuit board may also comprise an array of metallized pads, onto which a plurality of compressible connecting devices is attached. Then, the first circuit assembly can be interconnected to a second printed circuit board assembly, using the array of connecting devices and appropriate compression means as described in the first and second preferred embodiments.

It will be appreciated to those of ordinary skill in the art that the present invention can be embodied in other specific forms without departing from the spirit or scope of the present invention.

What is claimed is:

1. A method of joining a plurality of electrically conducting connectors to a respective plurality of electrically conductive pads on a substrate wherein each of said connectors includes a substantially flat surface region and a pair of independently compressible spring arms projecting from said surface region, said method comprising the steps of:

providing a fixture tool having a plurality of openings corresponding respectively to said plurality of electrically conductive pads of said substrate;

loading a plurality of said electrically conducting connectors into a respective plurality of openings in said tool such that said substantially flat surface of each of said connectors is exposed;

applying solder either to said substantially flat surface of each of said connectors or to each of said conductive pads of said substrate;

positioning said substrate adjacent to said tool such that said conductive pads are aligned with said substantially flat surfaces, respectively; and reflowing said solder while said connectors are still in said openings in said fixture tool to join said surface regions of said plurality of electrically conductive connectors to said plurality of electrically conductive pads, respectively.

2. The method of claim 1, wherein each of said pair of independently compressible spring arms includes an end section adapted for engaging an external conductive pad in a wiping form of engagement, said end sections of each of said connectors moving in substantially opposite directions on said external conductive pad during said engaging of said external conductive pad.

* * * * *